(12) United States Patent
Park et al.

(10) Patent No.: US 7,939,622 B2
(45) Date of Patent: May 10, 2011

(54) POLYMER COMPOUND AND ORGANIC LIGHT-EMITTING DEVICE USING THE SAME

(75) Inventors: Sang-Hoon Park, Yongin-si (KR); Yu-Jin Kim, Yongin-si (KR); Jong-Jin Park, Yongin-si (KR); Jhun-Mo Son, Yongin-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 71 days.

(21) Appl. No.: 11/802,720

(22) Filed: May 24, 2007

(65) Prior Publication Data

US 2007/0278455 A1    Dec. 6, 2007

(30) Foreign Application Priority Data

Jun. 5, 2006   (KR) .................. 10-2006-0050486

(51) Int. Cl.
- *C08G 73/06*   (2006.01)
- *C08G 59/00*   (2006.01)
- *C08G 65/00*   (2006.01)
- *C08G 75/00*   (2006.01)
- *H01B 1/12*    (2006.01)

(52) U.S. Cl. ........ 528/424; 528/171; 528/423; 528/403; 252/519.34

(58) Field of Classification Search .......... 528/171, 528/423, 424, 404; 252/519.34
See application file for complete search history.

(56) References Cited

U.S. PATENT DOCUMENTS

| | | | |
|---|---|---|---|
| 4,401,545 A * | 8/1983 | Naarmann et al. | 204/291 |
| 4,548,696 A * | 10/1985 | Weaver, Jr. | 428/457 |
| 4,952,667 A * | 8/1990 | Shikatani et al. | 528/230 |
| 5,151,629 A * | 9/1992 | VanSlyke | 313/504 |
| 5,874,179 A * | 2/1999 | Kreuder et al. | 428/690 |
| 5,879,821 A * | 3/1999 | Hsieh | 428/690 |
| 6,916,902 B2 | 7/2005 | Inbasekaran et al. | 528/397 |
| 6,942,931 B2 * | 9/2005 | Lee et al. | 428/690 |
| 6,984,461 B2 * | 1/2006 | Son et al. | 428/690 |
| 6,994,921 B2 * | 2/2006 | Noguchi et al. | 428/690 |
| 7,348,072 B2 * | 3/2008 | Park et al. | 428/690 |
| 2002/0048686 A1 * | 4/2002 | Suzuki et al. | 428/690 |
| 2002/0103332 A1 * | 8/2002 | Leclerc et al. | 528/423 |
| 2003/0194626 A1 * | 10/2003 | Zhu et al. | 430/58.45 |
| 2004/0034189 A1 * | 2/2004 | Cho et al. | 528/394 |
| 2004/0072989 A1 * | 4/2004 | Son et al. | 528/397 |
| 2005/0038223 A1 * | 2/2005 | Becker et al. | 528/86 |
| 2005/0064333 A1 * | 3/2005 | Crivello | 430/270.1 |
| 2005/0106418 A1 * | 5/2005 | Kim et al. | 428/690 |
| 2005/0123802 A1 * | 6/2005 | Park et al. | 428/690 |
| 2005/0164034 A1 * | 7/2005 | Park et al. | 428/690 |
| 2005/0186445 A1 * | 8/2005 | Zheng et al. | 428/690 |
| 2006/0083945 A1 * | 4/2006 | Morishita et al. | 428/690 |
| 2006/0199943 A1 * | 9/2006 | Falcou et al. | 528/422 |
| 2007/0003787 A1 * | 1/2007 | Lee et al. | 428/690 |
| 2007/0152573 A1 * | 7/2007 | Kim et al. | 313/506 |
| 2007/0155952 A1 * | 7/2007 | Park et al. | 528/423 |
| 2007/0173633 A1 * | 7/2007 | Son et al. | 528/423 |
| 2007/0196689 A1 * | 8/2007 | Ragini et al. | 428/690 |
| 2007/0235723 A1 * | 10/2007 | Li et al. | 257/40 |
| 2007/0270570 A1 * | 11/2007 | Wang et al. | 528/367 |
| 2007/0273273 A1 * | 11/2007 | Kim et al. | 313/504 |
| 2007/0281182 A1 * | 12/2007 | Schulte et al. | 428/690 |
| 2008/0003422 A1 * | 1/2008 | Ueda | 428/220 |
| 2008/0018238 A1 * | 1/2008 | Gessner et al. | 313/504 |

OTHER PUBLICATIONS

Henk J. Bolink et al, "Conductive Hybrid Films of Polyarylamine Electrochemically Oxidized with the Molecular Nanomagnet $[Mn_{12}O_{12}(H_2O)_4\text{-}(C_6F_5COO)_{16}]$", Advanced Materials 2005, 17, No. 8, p. 1018, Apr. 18, 2005.

C. W. Tang et al, "Organic electroluminescent diodes", Appl. Phys. Lett. 51(12), p. 913, Sep. 21, 1987.

* cited by examiner

*Primary Examiner* — Mark Eashoo
*Assistant Examiner* — Liam J Heincer
(74) *Attorney, Agent, or Firm* — Robert E. Bushnell, Esq.

(57) ABSTRACT

Provided are a polymer compound which has a pyrrole derivative compound and a phenoxazine derivative compound as a repeating unit, and an organic electroluminescent (EL) device using the same for forming a hole injection layer and/or a hole transport layer. The polymer compound according to the present invention has superior electric features and a high hole-transporting capability. Thus the organic EL device using the polymer compound for forming a hole injection layer and/or a hole transport layer has superior features such as low voltage and high efficiency compared to using conventional materials.

19 Claims, 3 Drawing Sheets

(A)  (B)  (C)

POLYMER COMPOUND AND ORGANIC LIGHT-EMITTING DEVICE USING THE SAME

CROSS-REFERENCE TO RELATED PATENT APPLICATION AND CLAIM OF PRIORITY

This application claims the benefit of Korean Patent Application No. 10-2006-0050486, filed on Jun. 5, 2006, in the Korean Intellectual Property Office, the disclosure of which is incorporated herein in its entirety by reference

BACKGROUND OF THE INVENTION

1. Field of the Invention

The present invention relates to a polymer compound and an organic light-emitting device (OLED) using the same, and more particularly, to a polymer compound which can be used for a hole injection layer and/or a hole transport layer and an organic light-emitting device (OLED) using the same.

2. Description of the Related Art

Luminescent display devices are self-emissive and known for their high visibility, excellent contrast and quick response time. Organic electroluminescent (EL) devices can be classified into inorganic EL devices using inorganic compounds for emissive layers, and organic EL devices using organic compounds for emissive layers. Research into organic EL devices has been increasing, since organic EL devices are known for their excellent luminance, low driving voltage, and fast response time, and are capable of forming multi-color images compared to inorganic EL devices.

For example, according to research conducted by Kodak Corporation in 1987 (Appl. Phys. Lett. 51, 913 (1987)), a separated-function type organic light-emitting device (OLED) having a bilayer structure emits light at an intensity of about 1,000 cd/m$^2$ at about 10 V of applied voltage by using ITO for an anode, Mg—Ag alloy for an cathode, tris(8-quinolinorate)aluminium (Alq3) for an electron-transporting material and an emissive material, triphenyl amine derivatives for a hole-transporting material. This OLED has a stacked structure of electron transport materials and hole transport materials and has an improved emitting property compared to a traditional single-layer type device.

In terms of material properties and manufacturing process, organic light-emitting display devices can be classified into devices using small-molecular materials and devices using polymer materials. Devices using small-molecular materials are manufactured by forming thin layers using vacuum deposition. In manufacturing devices using small-molecular materials, refinement and high purification of light-emitting materials and accomplishment of color pixels are easy. However, there are still problems such as crystallization in thin layers, and lower than desired quantum efficiency, thermostability, and color purity.

Research into OLEDs using polymer materials has proliferated since it was revealed that light is emitted when electricity is applied to poly(1,4-phenylenevinylene) (PPV) of π-conjugated polymer. π-conjugated polymers have an alternating chemical structure of single bonds (or σ-bond) and double bonds (or π-bond) and thus have π-electrons which are allowed to move quite freely and are evenly distributed within the bond chain. Due to such semi-conductive properties of π-conjugated polymers, π-conjugated polymers can be applied in emissive layers of organic light-emitting devices to emit light corresponding to the band gap between the Highest Occupied Molecular Orbital (HOMO) and the Lowest Unoccupied Molecular Orbital (LUMO) throughout the whole visible-light region using molecular design. Another advantage of OLEDs using polymers is that thin layers can simply be formed using a spin coating or printing method, and thus the manufacturing process is simplified and costs are reduced. In addition, polymers have a high glass transfer temperature and thus can be used to manufacture thin layers having superior mechanical features.

Thus, research into the application of polymer compounds to organic layers such as a hole injection layer, a hole transport layer, and an emissive layer of OLEDs is ongoing.

It is disclosed in the paper [Advanced materials 2005, 17(8), 1018] that a PEDOT/PSS (polyethylenedioxythiophen/polystylenesulfonate) can be used for hole injection layers of OLEDs, however, it is difficult to coat a large area and to form thick layers using PEDOT/PSS. Besides, when OLEDs are manufactured using vacuum deposition, moisture may be contained in the manufactured devices, which is undesirable for a practical process. In addition, fluoric-containing hydroPEDOT/PSS are unsuitable for forming evenly stacked layers due to the strong surface repulsion force of fluorine in the upper layer.

SUMMARY OF THE INVENTION

The present invention provides a novel polymer compound.

The present invention provides a polymer compound which is soluble to organic solvents and suitable for a hole injection layer or a hole transport layer of organic light-emitting devices.

Also, the present invention provides an organic light-emitting device using the polymer compound in the hole injection layer and/or the hole transport layer.

To achieve these and other objects, the present invention provides a polymer compound represented by Formula 1 below:

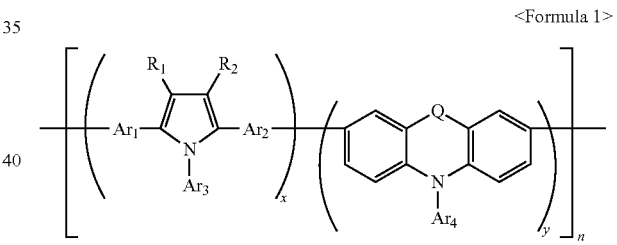

<Formula 1> where x and y are each real numbers from 0.01 to 0.99;

$R_1$ and $R_2$ are each independently selected from a hydrogen atom, a substituted or unsubstituted $C_1$-$C_{30}$ alkyl group, a substituted or unsubstituted $C_1$-$C_{30}$ cycloalkyl group, a substituted or unsubstituted $C_1$-$C_{30}$ alkoxy group, a substituted or unsubstituted $C_6$-$C_{30}$ aryl group, a substituted or unsubstituted $C_2$-$C_{30}$ heteroaryl group, a substituted or unsubstituted $C_4$-$C_{30}$ heterocyclic group, and $C_6$-$C_{30}$ fused aryl group, and the $R_1$ and $R_2$ can be joined to form a ring;

$Ar_1$ and $Ar_2$ are each independently selected from the group consisting of a substituted or unsubstituted $C_6$-$C_{30}$ arylene group, a substituted or unsubstituted $C_2$-$C_{30}$ heteroarylene group, a substituted or unsubstituted $C_2$-$C_{30}$ heterocyclic group, and a substituted or unsubstituted $C_2$-$C_{30}$ vinylene group;

$Ar_3$ and $Ar_4$ are each independently selected from the group consisting of a hydrogen, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_2$-$C_{30}$ heteroaryl group, a substituted or unsubstituted $C_2$-$C_{30}$ heterocyclic group, and $C_6$-$C_{30}$ fused aryl group;

Q is CH=CH, O, S, Se, or $(CH_2)_m$ where m is a real number from 1 to 10; and n is the degree of polymerization, and is a real number from 10 to 300.

The present invention also provides a polymer compound represented by Formula 1, having the number-average molecular weight (Mn) of 10,000 through 200,000.

The present invention also provides an organic electroluminescent (EL) device using the above polymer compound for forming organic layers between a pair of electrodes. The organic layer may be at least one of a hole injection layer and a hole transport layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
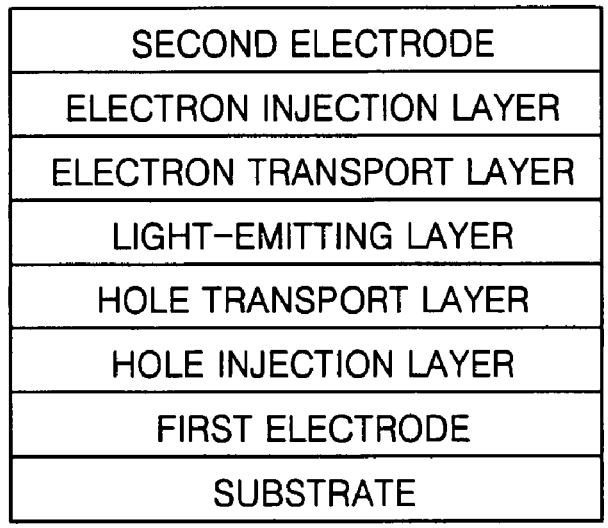
FIGS. 1A and 1B illustrate sectional views of organic light-emitting devices (OLEDs) which are manufactured using polymer compounds according to an embodiment of the present invention.

According to an embodiment of the present invention, a polymer compound represented by Formula 1 below is provided.

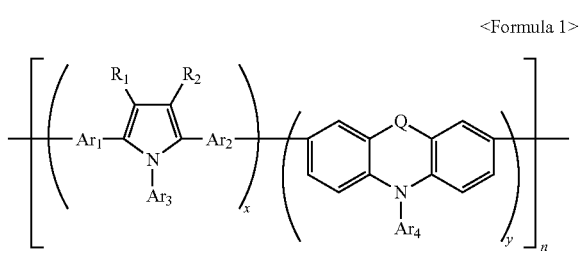

<Formula 1> where x and y are each real numbers from 0.01 to 0.99;

$R_1$ and $R_2$ are each independently selected from a hydrogen atom, a substituted or unsubstituted $C_1$-$C_{30}$ alkyl group, a substituted or unsubstituted $C_1$-$C_{30}$ cycloalkyl group, a substituted or unsubstituted $C_1$-$C_{30}$ alkoxy group, a substituted or unsubstituted $C_6$-$C_{30}$ aryl group, a substituted or unsubstituted $C_2$-$C_{30}$ heteroaryl group, a substituted or unsubstituted $C_4$-$C_{30}$ heterocyclic group, and a $C_6$-$C_{30}$ fused aryl group and $R_1$ and $R_2$ can be joined to form a ring;

$Ar_1$ and $Ar_2$ are each independently selected from the group consisting of a substituted or unsubstituted $C_6$-$C_{30}$ arylene group, a substituted or unsubstituted $C_2$-$C_{30}$ heteroarylene group, a substituted or unsubstituted $C_2$-$C_{30}$ heterocyclic group, and a substituted or unsubstituted $C_2$-$C_{30}$ vinylene group;

$Ar_3$ and $Ar_4$ are each independently selected from a hydrogen, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_2$-$C_{30}$ heteroaryl group, a substituted or unsubstituted $C_2$-$C_{30}$ heterocyclic group, and a $C_6$-$C_{30}$ fused aryl group;

Q is CH=CH, O, S, Se, or $(CH_2)_m$ where m is a real number from 1 to 10; and n is the degree of polymerization and a real number from 10 to 300.

$R_1$ and $R_2$ may be each independently selected from the group consisting of a hydrogen, a methyl, an ethyl, a propyl, an isopropyl, a butyl, an isobutyl, a pentyl, a hexyl, an ethylhexyl, a heptyl, an octyl, an isooctyl, a nonyl, a decyl, a dodecyl, a hexadecyl, an octadecyl, a docodecyl, a cyclopropyl, a cyclopentyl, a cyclohexyl, an acetyl, an octanoyl, a benzoyl, a methoxy, an ethoxy, an ethylenedioxy, a butoxy, a hexyloxy, a methoxyethoxyethyl, a methoxyethoxyethoxyethyl, a cyanoethyl, a carboxymethyl, a phenyl, a phenoxy, a tolyl, a benzyl, a naphthylanthracenyl, a terphenyl, a pyrenyl, a diphenylanthracenyl, a pentacenyl, a triphenylamine, and derivatives thereof.

$Ar_1$ and $Ar_2$ may be each independently selected from a phenylene, a tolylene, a naphthylene, a stilbenzylene, a fluorenylene, an anthracenylene, a terphenylene, a pyrenylene, a diphenylanthracenylene, a dinaphthylanthracenylene, a pentacenylene, and derivatives thereof.

$Ar_3$ and $Ar_4$ may be one selected from the group consisting of a hydrogen, a phenyl, a tolyl, a naphthyl, a stilbenzyl, a fluorenyl, an anthracenyl, a terphenyl, a pyrenyl, a diphenylanthracenyl, a dinaphthylanthracenyl, a pentacenyl and derivatives thereof, a hexylphenyl, an octanoylphenyl, a bromophenyl, a hydroxyphenyl, a thienyl, a pyridyl, an azobenzenyl, a ferrocenyl, a carbazoyl, a porphyrin and derivatives thereof.

The above polymer compound represented by Formula 1 may be, in particular, a polymer compound represented by one selected from Formulae 2 through 7.

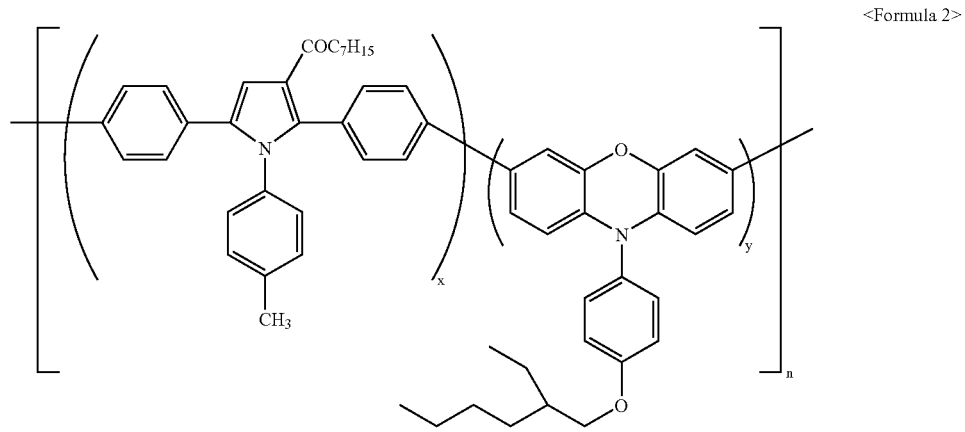

<Formula 2>

-continued
<Formula 3>
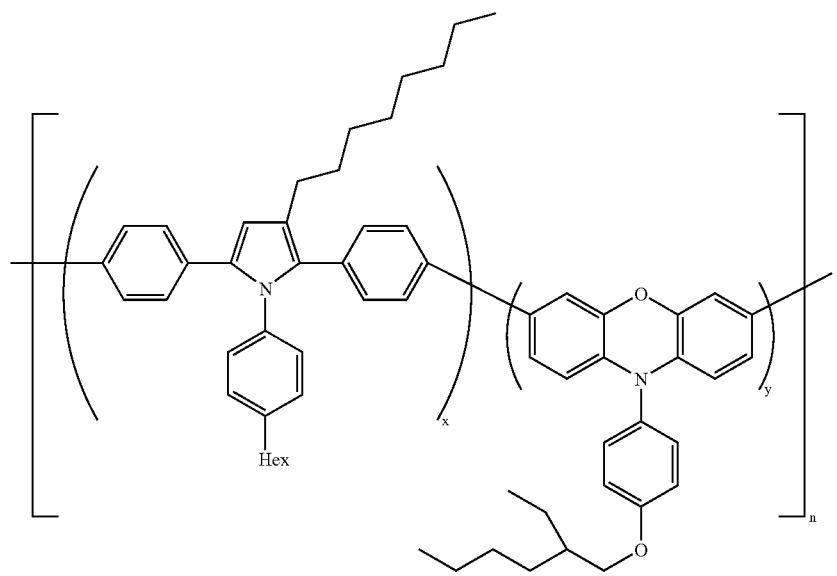
<Formula 4>
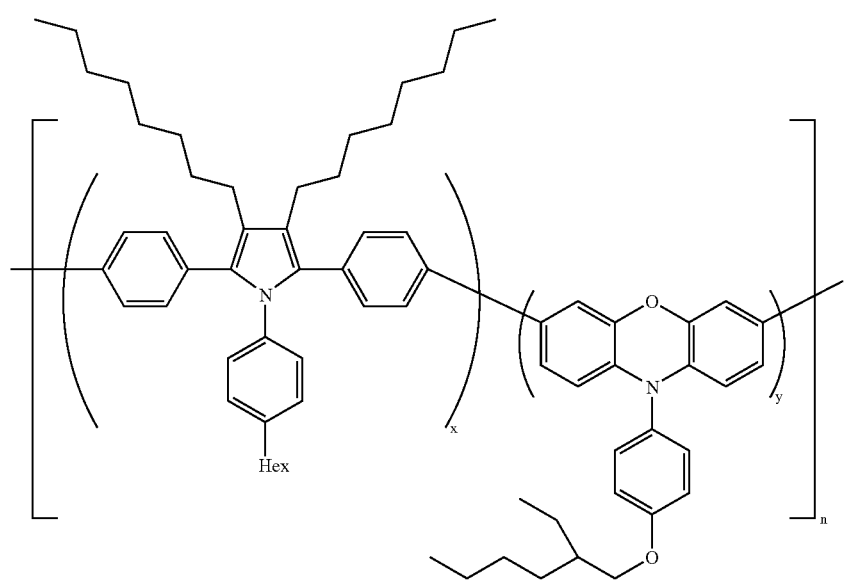
<Formula 5>
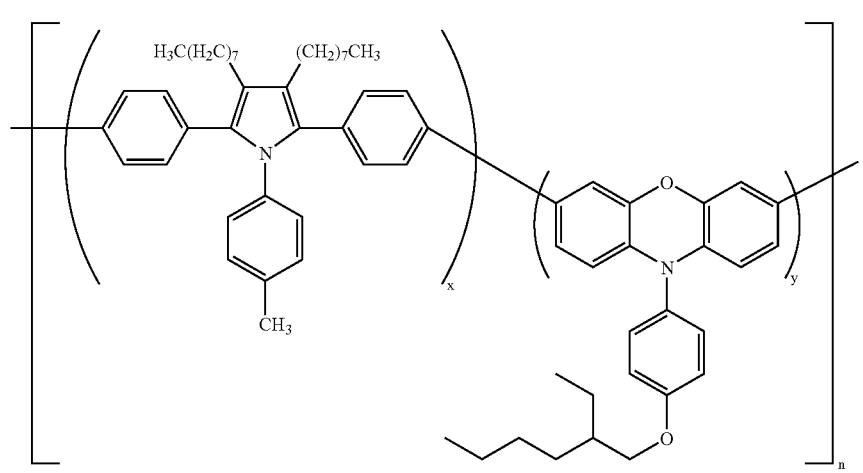

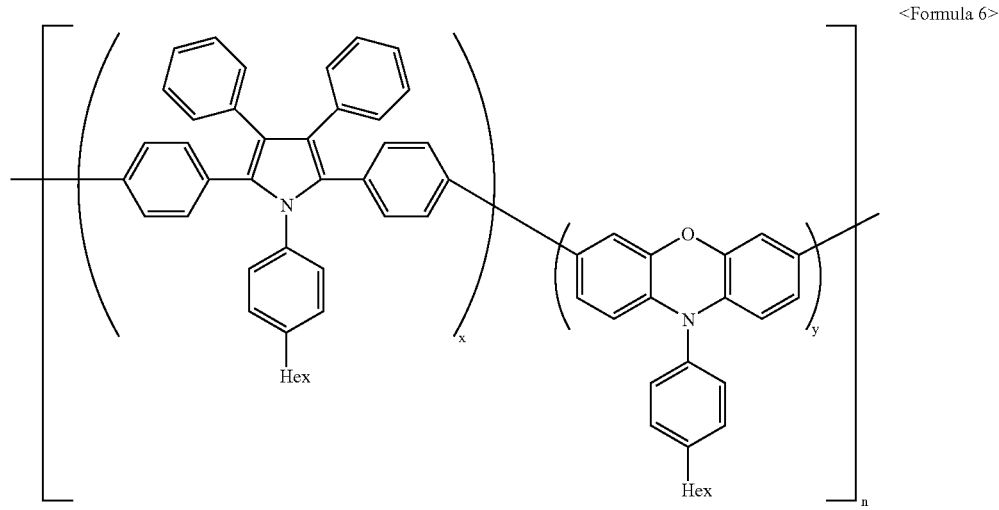

<Formula 6>

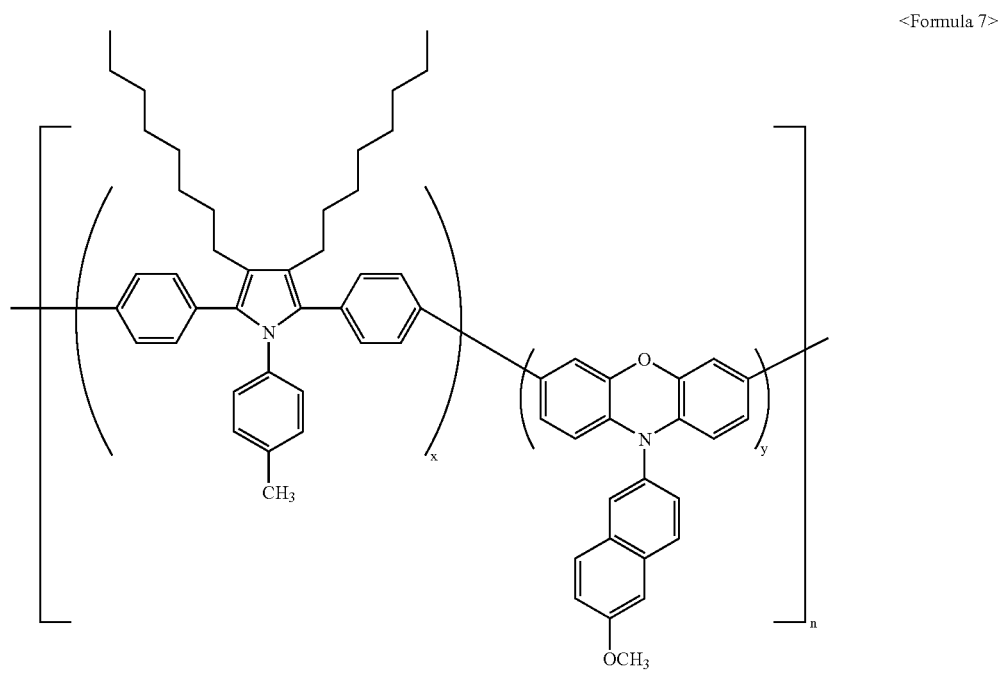

<Formula 7> where x and y are each a real number from 0.01 to 0.99, n is the degree of polymerization, and a real number from 10 to 150, and Hex is a hexyl group.

The number-average molecular weight (Mn) of the polymer compounds of the present invention may be 10,000 through 200,000. The lower limit is 10,000 because polymers having a molecular weight less than 10,000 are crystallized in the manufacture and driving of devices. The upper limit is 200,000 because polymers having a molecular weight greater than 200,000 have low solubility and poor processability.

The polymer compounds of the present invention have wide band gap energy according to the composition rate of monomers, and show ionization potential at a similar level of ITO. The polymer compounds of the present invention are soluble to organic solvents and are selectively soluble to solvents, and can be made into amorphous film shapes. Thus, the polymer compounds of the present invention are suitable as materials for hole injection layers and hole transport layers in OLEDs.

According to an embodiment of the present invention, it is possible to coat a large-area, form a thick-layer, and to improve process yield by not using aqueous polymers. The life span of devices can also be enhanced by removing moisture from devices. The polymer compounds of the present invention can also be excellent materials in terms of thermostability since $R_1$ and $R_2$ in the above Formula 1 can build a crosslinkable structure according to the shapes of $R_1$ and $R_2$.

The polymer compounds of the present invention can further include a dopant in forming organic layers. The dopant may be at least one selected from acceptor material, organic metal complex, metal oxide, and ion salt.

The acceptor material may be at least one of a Lewis acid, a halide, and a tetrafluorotetracyanoquinonedimethane (F4TCNQ) that is represented by the following formula 8:

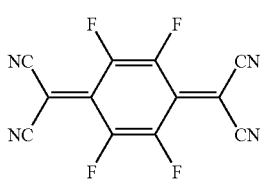

(8)

The present invention provides polymer compounds that are used for organic layers such as hole injection layers or hole transport layers in OLEDs.

Figure 1B:
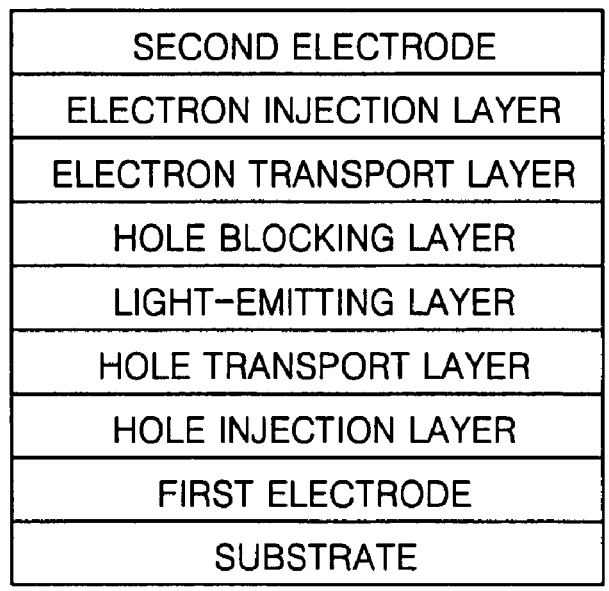

FIGS. 1A and 1B illustrate sectional views of exemplary OLEDs which are manufactured using polymer compounds according to embodiments of the present invention. FIG. 1A shows a structure of substrate/first electrode/hole injection layer/hole transport layer/polymer emissive layer/electron transport layer/electron injection layer/second electrode, and FIG. 1B shows a structure of substrate/first electrode/hole injection layer/hole transport layer/polymer emissive layer/hole blocking layer/electron transport layer/electron injection layer/second electrode, however, the present invention is not limited thereto.

Provided is a method of manufacturing an OLED according to an embodiment of the present invention.

First, for an anode, an electrode material having a high work function is formed on a substrate. The substrate can be any substrate which is used in common OLEDs and may be a glass substrate or a transparent plastic substrate which has superior mechanical strength, thermostability, transparency, surface smoothness, ease of treatment, and waterproofness. The electrode material for an anode is highly conductive transparent ITO, IZO, $SnO_2$, or ZnO.

Next, a hole injection layer (HIL) is formed on the anode. The hole injection layer can be formed using a compound represented by Formula 1, and the appropriate compound can be chosen according to the structure and thermal properties of the hole injection layer.

Next, a hole transport layer (HTL) is formed on the hole injection layer. The hole transport layer can be formed using a compound represented by Formula 1, and can be selected according to the structure and thermal properties of the hole injection layer.

Next, an emissive layer (EML) is formed on the hole transport layer. The EML materials are not particularly limited. For example, a fluorescent host may be $Alq_3$, fluorescent dopants may be IDE 102 and/or IDE 105 which can be purchased from Idemitsu Corporation and C545T which can be purchased from Hayashibara Biochemical Laboratories, Inc., and phosphorescent dopants may be $Ir(ppy)_3$ for green-phosphorescence, $F_2Irpic$ for blue-phosphorescence, and RD 61 of UDC Corporation for red-phosphorescence. Doping concentration is not particularly limited, however 0.01 to 15 w % of dopant with respect to the host is commonly used.

When a phosphorescent dopant is co-used in the EML, a hole blocking layer (HBL) may be further deposited to prevent triplet excitons or holes from diffusing to an electron transport layer (ETL). The HBL material is not limited to particular materials. Examples of the HBL materials are oxadiazole derivatives, triazole derivatives, phenanthroline derivatives, or a hole blocking material that is disclosed in JP 11-329734. Typically used HBL materials are aluminum(III) bis(2-methyl-8-quinolinato)$_4$-phenylphenolate (Balq) or 2,9-dimethyl-4,7-diphenyl-1,10-phenanthroline (BCP).

Then an electron transport layer (ETL) is formed. ETL materials whose function is safely transporting electrons injected from a cathode to an emissive layer are not limited to particular materials. For example, quinoline derivatives, in particular tris(8-quinolinorate)aluminium ($Alq_3$) can be used to form the ETL.

Then, materials for an electron injection layer (EIL), whose function is helping electron injection from the cathode, can be deposited on the ETL and are not limited to particular materials. For example, the EIL can be formed of LiF, NaCl, CsF, $Li_2O$, BaO.

The hole blocking layer (HBL), electron transport layer (ETL), and electron injection layer (EIL) are formed using various deposition conditions according to the compounds being used, however, usually are formed using the similar condition range under which a hole injection layer (HIL) is formed.

The cathode is formed on the EIL, and can be formed of a metal having a low work function, an alloy, a conductive compound or a mixture thereof. For example, Li, Mg, Al, Al—Li, Ca, Mg—In, Mg—Ag, etc. can be used to form the cathode. Also, a transparent type cathode formed of ITO or IZO can be used in a top-emission type OLED.

OLEDs of the present invention can have various structures in addition to the structures of FIGS. 1A and 1B, and can have additional intermediate layers when they are necessary.

Figure 2A:
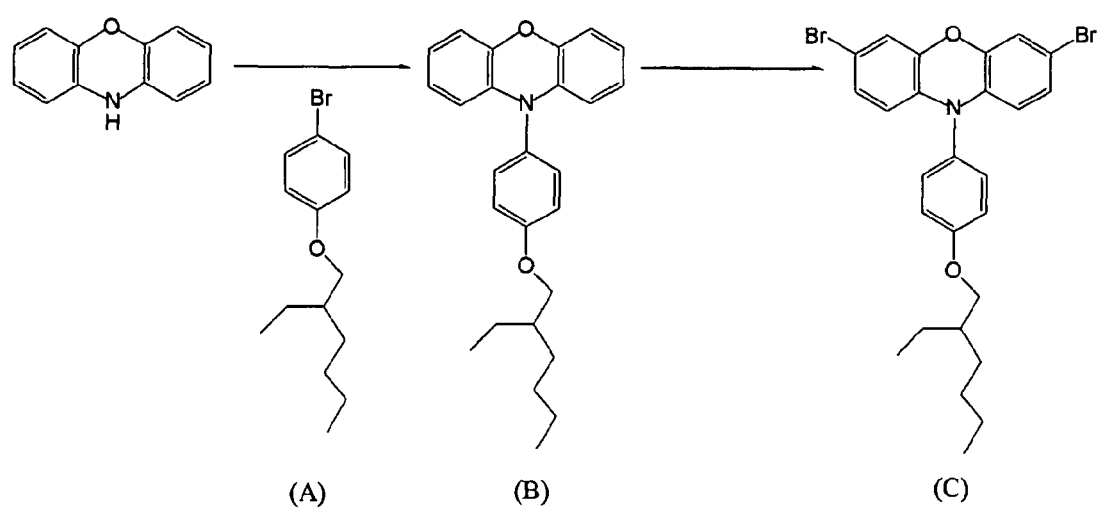
FIGS. 2A and 2B are drawings showing steps of a method of manufacturing a compound represented by compound 2 of the present invention.
Figure 2B:
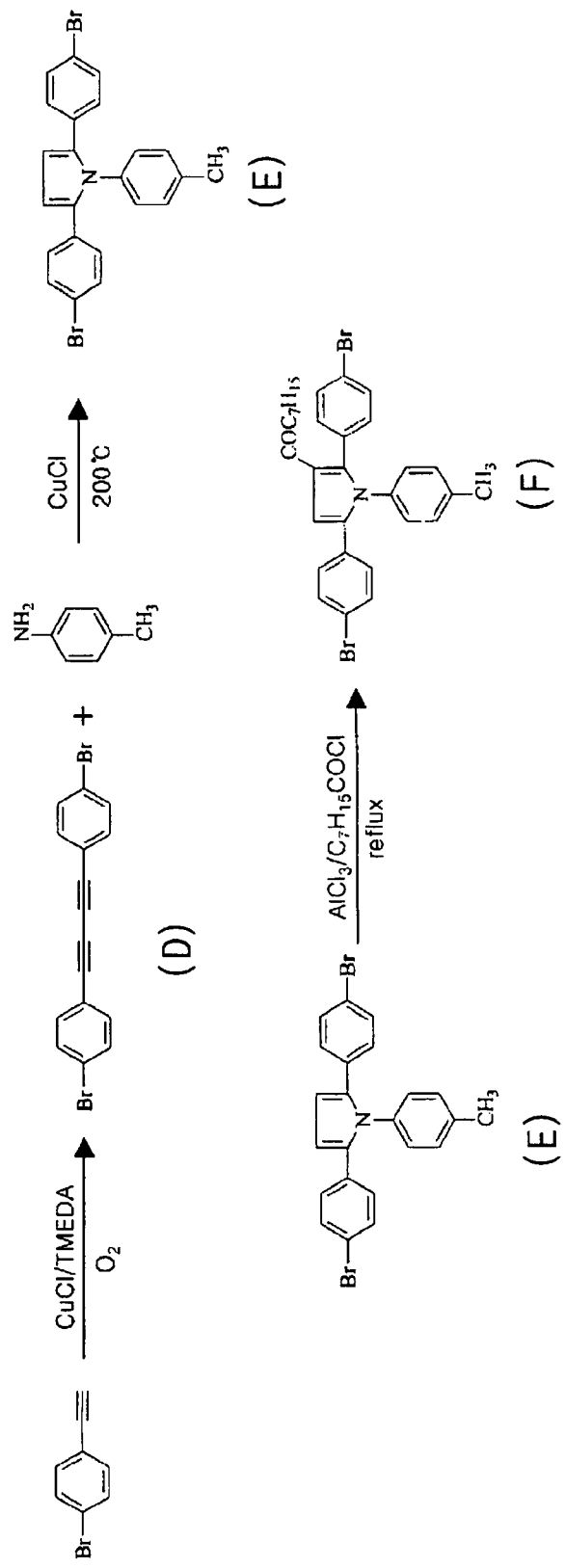

Hereinafter, the present invention will be described more specifically with reference to the following examples and FIGS. 2A and 2B. However, these examples are provided for illustrative purposes only and are not intended to limit the scope of the invention.

SYNTHESIS EXAMPLES

Synthesis of Phenoxazine Monomer

1) Preparation of Compound (A)

50 g (0.29 mole) of 4-bromophenol was dissolved in 500 ml of acetone, and 48.4 g (0.35 mole) of $K_2CO_3$ was added thereto. Then, 73.3 g (0.38 mole) of 1-bromooctane was added to the mixture and the mixture was refluxed for 24 hours.

After the reaction was ended, an organic layer was extracted using a solution of water:$CHCl_3$=2:1 (volume-ratio), and $K_2CO_3$ is removed. The organic layer was dried with $MgSO_4$, condensed, and applied to silica-gel column chromatography using hexane as an eluent. The unreactant 1-bromooctane was removed from the resulting eluate, using distillation under reduced pressure, thereby resulting in 80 g of compound (A) (yield: 96%) The structure of compound (A) was identified using $^1$H-NMR.

2) Preparation of Compound (B)

18 g (64 mmol) of compound (A), 10 g (54 mmol) of phenoxazine, 7.4 g (77 mmol) of sodium tert-butoxide, 0.61 g (1.1 mmol) of (Tris(dibenzylidene acetone)dipalladium(0)) ($Pd(dba)_2$), and 0.22 g (1.1 mmol) of tri (tert-butyl)phosphine were dissolved in 250 ml of xylene, and the solution was put at 80° C. for 12 hours for reaction to occur.

After the reaction ended, the reaction mixture was cooled to room temperature, and quenched by adding 200 ml of distilled water. Then, an organic layer was extracted using a solution of xylene:water=1:1 (volume ratio). The collected organic layer was dried with $MgSO_4$, condensed, and applied to silica-gel column chromatography using toluene:hexane=1:2 (volume ratio) as an eluent. The resulting eluate was condensed and dried, thereby producing 18.5 g of compound (B) (yield: 88%). The structure of compound (B) was identified using $^1$H-NMR.

3) Synthesis of Compound (C)

5 g (13 mmol) of compound (B) was dissolved in 150 ml of $CHCl_3$, and 2.1 equivalent of bromine was slowly added thereto, keeping the temperature (of the solution) at 0° C. When the starting material disappeared in Thin Layer Chromatography (TLC), the bromine addition was stopped. After the reaction mixture was stirred for 10 minutes, the reaction was stopped.

Bromine was quenched by adding a small quantity of acetone to the reaction mixture. Then an organic layer was extracted using a solution of water:$CHCl_3$=2:1 (volume ratio). The collected organic layer was dried with $MgSO_4$, condensed, and was re-sedimented in MeOH, thereby resulting in 6 g of compound (C) (yield: 85%). The structure of compound (C) was identified using $^1$H-NMR.

$^1$H-NMR (300 MHz, $CDCl_3$): δ 0.91(m, 6H), δ1.45(m, 8H), δ1.82(m, 1H), δ3.89(d, 2H), δ5.82(d, 2H), δ6.5-7.5(m, 8H)

Synthesis of Pyrrole Monomer

1) Preparation of Compound (D)

500 mL of acetone as a solvent was put into 1 L round-bottomed flask to which a mechanical stirring machine attached, and 40.75 g (225 mmol) of para-bromophenylacetylene was added thereto. Then 1.11 g (14 mmol) of copper chloride (I) and 1.31 g (14 mmol) of N,N,N',N'-tetramethylethylenediamine (TMEDA) were added thereto, and the mixture was strongly stirred for one hour at room temperature, keeping bubbling oxygen. After the reaction was ended, the acetone was removed. Then the reactants were sedimented in 5% hydrochloric acid, thereby resulting in a light-yellow solid pre-product. The pre-product was recrystallized in chloroform and was dried, thereby resulting in 39.8 g of light-yellow solid product (yield 98.2%). The melting point of the pre-product was 264-265° C.

2) Synthesis of Compound (E)

Under Argon, 31.6 g (88 mmol) of compound (D), 15.1 g (88 mmol) of p-toluidine and 2.17 g (22 mmol) of copper chloride (I) were put into a 500 mL round-bottomed flask, and the mixture was stirred for 5 hours at 200° C. for reaction to occur. After the reaction ended, the reaction mixture was cooled. Then the reactants were dissolved in chloroform, and washed several times with 5% hydrochloric acid. The organic solution washed several times with water, and dried with anhydride magnesium sulfate, and the solvent was removed to obtain a solid pre-product. The pre-product was recrystallized using ethyl acetate and chloroform, thereby producing 28.5 g (69.6%) of white solid product. The melting point of the product was 262-264° C.

3) Synthesis of Compound (F)

0.68 g (5.1 mmol) of aluminium trichloride and 50 mL of chloroform were put into a 500 mL round-bottomed flask which was equipped with a reflux condenser and a dripping funnel, and stirred, during which 0.83 g (5.1 mmol) of octanoylmethylchloride was diluted in 10 mL of chloroform and added to the above solution using the dripping funnel at room temperature. Then, 1.5 g (4.8 mmol) of compound (E) was dissolved in 20 mL chloroform, and added to the above solution using the dripping funnel. The reaction solution was put at 50° C. for 24 hours for reaction to occur. After the reaction ended, the product was put into 100 g of ice. Then an organic layer was collected and washed several times with water. The obtained organic solution was dried with anhydride magnesium sulfate, removed of solvent, and refined through column chromatography(ethylacetate/hexane(1:5)), thereby resulting in 1.97 g of pure light-yellow viscid oil (yield 93.4%).

$^1$H-NMR(CDCl3): δ=0.86 (t, 3H, —CH3), 1.13-1.75 (m, 10H, —CH2—), 2.21 (s, 3H, —CH3), 2.38 (t, 2H, —COCH2—), 6.81-7.23(m, 15H, —CH— and aromatic)

Synthesis of Polymer

The inside of a Schlenk flask was vacuumized and nitrogen-refluxed several times to completely eliminate moisture. 880 mg (3.2 mmol) of bis(1,5-cyclooctadiene)nickel(O) (Ni (COD)) and 500 mg (3.2 mmol) of bipyridal were put into the Schlenk flask in a glove box, and the inside of the flask was vacuumized and refluxed several times. Then, under nitrogen, 10 ml of anhydride dimethylfuran (DMF), 346 mg (3.2 mmol) of 1,5-cyclooctadiene (COD), and 10 ml of anhydride toluene were added thereto, and the mixture was stirred for 30 minutes at 80° C. Then 0.47 g (1.0 mmol) of compound (F) of pyrrole monomer, and 0.44 g (1.0 mmol) of compound (C) of phenoxazine monomer were diluted in 10 ml of toluene, and added to the above mixture.

Then, 10 ml of toluene was added thereto, washing materials adhering to the walls, and the reaction solution was stirred for 4 days at 80° C. After stirring ended, the temperature of reaction solution was cooled to 60° C. Then the reaction solution was added to a HCl:acetone:methanol=1:1:2 solution to form sediments. The sediments were dissolved in chloroform, then precipitated in methanol, and applied to soxhlet, thereby resulting in 400 mg of macromolecular polymer of Formula 2. Mn=120,000

Example 1

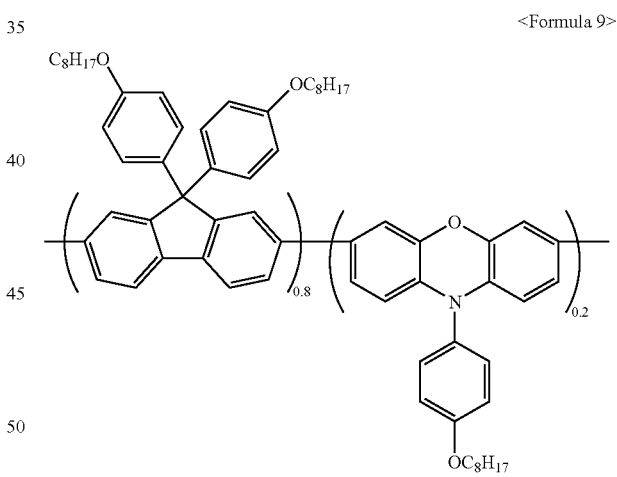

<Formula 9>

First, a transparent electrode substrate was prepared by coating indium-tin oxide (ITO) on a glass substrate and washing the substrate. Then ITO was patterned using photoresist resin and etchant to desired patterns and the substrate washed. A hole injection layer was formed by coating the compound of Formula 2 on the substrate using a solution process where toluene was used as a solvent, to a thickness of about 50 nm, and baking at 110° C. for about one hour. Then, an emissive layer forming material was prepared by dissolving 0.8 weight % of the polymer of Formula 9 in 99.2 weight % of m-xylene. The polymer solution was filtered with 0.45 μm filter, and the material was spin-coated on the hole injection layer, baked, and removed completely of solvent in vacuum oven to form a polymer thin layer. The thickness of the polymer thin layer was controlled to about 80 nm by controlling the concentration and the spin-speed of the polymer solution. Then, 2.7 nm of a Ca layer and an Al layer were sequentially deposited on the electroluminescent polymer thin layer, keeping the vacuum degree below $4\times10^{-6}$ torr using a vapor deposition. While depositing, the thickness of the layers and the deposition rate were controlled using a crystal sensor.

The turn-on voltage of the device was 4.2 V, the light-emitting efficiency was 3.1 cd/A, and the color coordinates were (0.16, 0.28).

Example 2

An organic EL device was manufactured using the process of Example 1 except that 5 weight % of tetrafluorotetracyanoquinonedimethane (F4TCNQ) relative to the weight of the host was co-injected as a dopant with the compound of Formula 2 to form a hole injection layer.

The turn-on voltage of the device was 3.5V, the light-emitting efficiency was 4.6 cd/A, and the color coordinates were (0.16, 0.28).

Example 3

An organic EL device was manufactured using the process of Example 1 except that 10 weight % of tetrafluorotetracyanoquinonedimethane (F4TCNQ) relative to the weight of the host was co-injected as dopant with the compound of Formula 2 to form a hole injection layer.

The turn-on voltage of the device was 2.6 V, the light-emitting efficiency was 5.3 cd/A, and the color coordinates were (0.16, 0.28).

Comparative Example 1

An organic EL device was manufactured using the process of Example 1 except that a hole injection layer was formed of PEDOT compound instead of the compound of Formula 2.

The turn-on voltage of the device was 3.0 V, the light-emitting efficiency was 3.5 cd/A, and the color coordinates were (0.16, 0.28).

Comparative Example 2

An organic EL device was manufactured using the process of Example 1 except that a hole injection layer was formed of a homopolymer of pyrrole monomer compound F (This polymer is referred to as KH compound hereinafter) instead of the compound of Formula 2.

The turn-on voltage of the device was 13.5 V, the light-emitting efficiency was 1.5 cd/A, and the color coordinates were (0.16, 0.28).

Comparative Example 3

An organic EL device was manufactured using the process of Example 1 except that a hole injection layer was formed of the KH compound and 3 weight % F4TCNQ (relative to the weight of the host) as a dopant instead of the compound of Formula 2.

The turn-on voltage of the device was 14.0 V, the light-emitting efficiency was 2.1 cd/A, the color coordinates were (0.16, 0.28).

Comparative Example 4

An organic EL device was manufactured using the process of Example 1 except that a hole injection layer was formed of the KH compound and 10 weight % F4TCNQ (relative to the weight of the host) as a dopant instead of the compound of Formula 2.

The turn-on voltage of the device was 11.5 V, the light-emitting efficiency was 2.3 cd/A, and the color coordinates were (0.16, 0.28).

Comparative Example 5

An organic EL device was manufactured using the process of Example 1 except that a hole injection layer was formed of the KH compound instead of the compound of Formula 2, and 20 weight % F4TCNQ (relative to the weight of the host) as a dopant.

The turn-on voltage of the device was 8.5V, the light-emitting efficiency was 3.0 cd/A, and the color coordinates were (0.16, 0.28).

The turn-on voltage, light emitting efficiency and color coordinates of Examples 1 through 3 and Comparative Examples 1 through 5 are shown in Table 2.

TABLE 1

|  | Turn-on voltage(V) | light-emitting efficiency (cd/A) | the color coordinate(x, y) |
| --- | --- | --- | --- |
| Example 1 | 4.2 | 3.1 | 0.16, 0.28 |
| Example 2 | 3.5 | 4.6 | 0.16, 0.28 |
| Example 3 | 2.6 | 5.3 | 0.16, 0.28 |
| Comparative Example 1 | 3.0 | 3.5 | 0.16, 0.28 |
| Comparative Example 2 | 13.5 | 1.5 | 0.16, 0.28 |
| Comparative Example 3 | 14.0 | 2.1 | 0.16, 0.28 |
| Comparative Example 4 | 11.5 | 2.3 | 0.16, 0.28 |
| Comparative Example 5 | 8.5 | 3.0 | 0.16, 0.28 |

Using the polymer compound according to an embodiment of the present invention decreases the energy barrier while also increasing the hole-transporting capability, thereby lowering the turn-on voltage and increasing the light-emitting efficiency. Also, co-using dopant materials improves hole-transportability, thereby increasing conductivity. Therefore, an organic light-emitting device using the polymer compound according to the present invention can have higher luminance at a reduced applied voltage.

While this invention has been particularly shown and described with reference to embodiments thereof, it will be understood by those skilled in the art that various changes in form and details may be made therein without departing from the spirit and scope of the invention as defined by the appended claims.

What is claimed is:

1. A polymer compound for hole-injection or hole-transportation, the polymer compound represented by Formula 1:

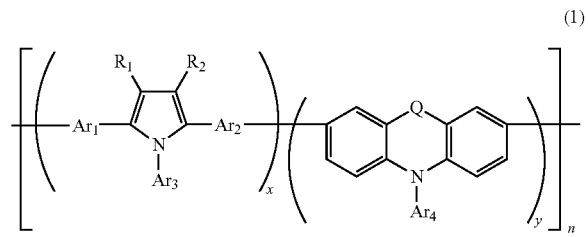

where x and y are each real numbers from 0.01 to 0.99;
$R_1$ and $R_2$ are each independently selected from the group consisting of a hydrogen atom, a substituted or unsubstituted $C_1$-$C_{30}$ alkyl group, a substituted or unsubstituted $C_1$-$C_{30}$ cycloalkyl group, a substituted or unsubstituted $C_1$-$C_{30}$ alkoxy group, a substituted or unsubstituted $C_6$-$C_{30}$ aryl group, a substituted or unsubstituted $C_2$-$C_{30}$ heteroaryl group, a substituted or unsubstituted $C_4$-$C_{30}$ heterocyclic group, and $C_6$-$C_{30}$ fused aryl group, and $R_1$ and $R_2$ can be joined to form a ring;

$Ar_1$ and $Ar_2$ are each independently selected from the group consisting of a phenylene, a tolylene, a naphthylene, a stilbenylene, an anthracenylene, a terphenylene, a pyrenylene, a diphenylanthracenylene, a dinaphthylanthracenylene, a pentacenylene, derivatives thereof, a substituted or unsubstituted $C_2$-$C_{30}$ heteroarylene group, and a substituted or unsubstituted $C_2$-$C_{30}$ heterocyclic group;

$Ar_3$ is each independently selected from the group consisting of a hydrogen, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_2$-$C_{30}$ heteroaryl group, a substituted or unsubstituted $C_2$-$C_{30}$ heterocyclic group, and a $C_6$-$C_{30}$ fused aryl group;

$Ar_4$ is each independently selected from the group consisting of a hydrogen, a substituted or unsubstituted $C_1$-$C_{30}$ alkyl group, a substituted or unsubstituted $C_1$-$C_{30}$ alkoxy group, a substituted or unsubstituted $C_2$-$C_{30}$ heteroaryl group, a substituted or unsubstituted $C_2$-$C_{30}$ heterocyclic group, and a substituted or unsubstituted $C_6$-$C_{30}$ fused aryl group;

Q is CH=CH, O, S, Se, or $(CH_2)_m$ where m is a real number from 1 to 10; and n is the degree of polymerization, and is a real number from 10 to 300.

2. The polymer compound of claim 1, wherein $R_1$ and $R_2$ are each independently selected from the group consisting of a hydrogen, a methyl, an ethyl, a propyl, an isopropyl, a butyl, an isobutyl, a pentyl, a hexyl, an ethylhexyl, a heptyl, an octyl, an isooctyl, a nonyl, a decyl, a dodecyl, a hexadecyl, an octadecyl, a docodecyl, a cyclopropyl, a cyclopentyl, a cyclohexyl, an acetyl, an octanoyl, a benzoyl, a methoxy, an ethoxy, an ethylenedioxy, a butoxy, a hexyloxy, a methoxyethoxyethyl, a methoxyethoxyethoxyethyl, a cyanoethyl, a carboxymethyl, a phenyl, a phenoxy, a tolyl, a benzyl, a naphthylanthracenyl, a terphenyl, a pyrenyl, a diphenylanthracenyl, a pentacenyl, a triphenylamine, and derivatives thereof.

3. The polymer compound of claim 1, wherein $Ar_3$ is selected from the group consisting of a hydrogen, a phenyl, a tolyl, a naphthyl, a stilbenzyl, a fluorenyl, an anthracenyl, a terphenyl, a pyrenyl, a diphenylanthracenyl, a dinaphthylanthracenyl, a pentacenyl and their derivatives, a hexylphenyl, an octanoylphenyl, a bromophenyl, a hydroxyphenyl, a thienyl, a pyridyl, an azobenzenyl, a ferrocenyl, a carbazoyl, a porphyrin and derivatives thereof.

4. The polymer compound of claim 1, wherein the polymer compound is represented by Formula 7:

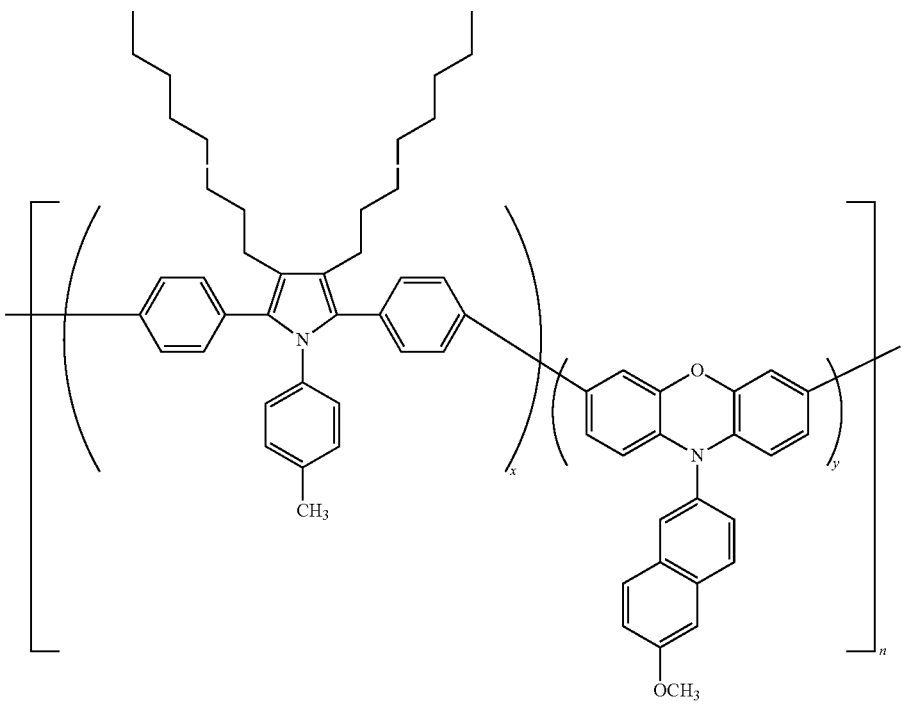

(7)

where x and y are each real numbers from 0.01 to 0.99, n is the degree of polymerization and is a real number from 10 to 150.

5. An organic electroluminescent device comprising an organic layer between a pair of electrodes, the organic layer containing the polymer compound of claim 1.

6. The organic electroluminescent device of claim 5, wherein the organic layer containing the polymer compound comprises at least one of a hole injection layer and a hole transport layer.

7. The organic electroluminescent device of claim 5, wherein the organic layer further comprises a dopant.

8. The organic electroluminescent device of claim 7, wherein the dopant is at least one selected from the group consisting of an acceptor material, an organic metal complex, a metal oxide, and an ion salt.

9. The organic electroluminescent device of claim 5, wherein the number-average molecular weight (Mn) of the polymer compound is 10,000 through 200,000.

10. A polymer compound for hole-rejection or hole-transportation, the polymer compound represented by Formula 1:

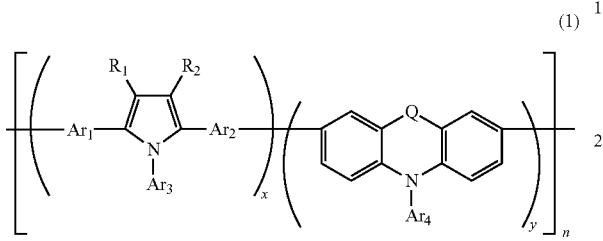

where x and y are each real numbers from 0.01 to 0.99;

$R_1$ and $R_2$ are each independently selected from the group consisting of a hydrogen atom, a substituted or unsubstituted $C_1$-$C_{30}$ alkyl group, a substituted or unsubstituted $C_1$-$C_{30}$ cycloalkyl group, a substituted or unsubstituted $C_1$-$C_{30}$ alkoxy group, a substituted or unsubstituted $C_6$-$C_{30}$ aryl group, a substituted or unsubstituted $C_2$-$C_{30}$ heteroaryl group, a substituted or unsubstituted $C_4$-$C_{30}$ heterocyclic group, and $C_6$-$C_{30}$ fused aryl group, and $R_1$ and $R_2$ can be joined to form a ring;

$Ar_1$ and $Ar_2$ are each independently selected from the group consisting of a substituted or unsubstituted $C_6$-$C_{30}$ arylene group, a substituted or unsubstituted $C_2$-$C_{30}$ heteroarylene group, and a substituted or unsubstituted $C_2$-$C_{30}$ heterocyclic group;

$Ar_3$ and $Ar_4$ are each independently selected from the group consisting of a hydrogen, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_2$-$C_{30}$ heteroaryl group, a substituted or unsubstituted $C_2$-$C_{30}$ heterocyclic group, and a $C_6$-$C_{30}$ fused aryl group;

Q is CH=CH; and n is the degree of polymerization, and is a real number from 10 to 300; and the number-average molecular weight (Mn) of the polymer compound is 10,000 through 200,000.

11. The polymer compound of claim 10, wherein $R_1$ and $R_2$ are each independently selected from the group consisting of a hydrogen, a methyl, an ethyl, a propyl, an isopropyl, a butyl, an isobutyl, a pentyl, a hexyl, an ethylhexyl, a heptyl, an octyl, an isooctyl, a nonyl, a decyl, a dodecyl, a hexadecyl, an octadecyl, a docodecyl, a cyclopropyl, a cyclopentyl, a cyclohexyl, an acetyl, an octanoyl, a benzoyl, a methoxy, an ethoxy, an ethylenedioxy, a butoxy, a hexyloxy, a methoxyethoxyethyl, a methoxyethoxyethoxyethyl, a cyanoethyl, a carboxymethyl, a phenyl, a phenoxy, a tolyl, a benzyl, a naphthylanthracenyl, a terphenyl, a pyrenyl, a diphenylanthracenyl, a pentacenyl, a triphenylamine, and derivatives thereof;

$Ar_1$ and $Ar_2$ are each independently selected from the group consisting of a phenylene, a tolylene, a naphthylene, a stilbenzylene, a fluorenylene, an anthracenylene, a terphenylene, a pyrenylene, a diphenylanthracenylene, a dinaphthylanthracenylene, a pentacenylene, and derivatives thereof; and $Ar_3$ and $Ar_4$ are selected from the group consisting of a hydrogen, a phenyl, a tolyl, a naphthyl, a stilbenzyl, a fluorenyl, an anthracenyl, a terphenyl, a pyrenyl, a diphenylanthracenyl, a dinaphthylanthracenyl, a pentacenyl and their derivatives, a hexylphenyl, an octanoylphenyl, a bromophenyl, a hydroxyphenyl, a thienyl, a pyridyl, an azobenzenyl, a ferrocenyl, a carbazoyl, a porphyrin and derivatives thereof.

12. An organic electroluminescent device comprising an organic layer between a pair of electrodes, wherein the organic layer contains the polymer compound of claim 10.

13. An organic electroluminescent device, comprising:
a first electrode;
a second electrode; and
an organic layer between the first electrode and the second electrode, the organic layer comprising an emissive layer and at least one of a hole injection layer and a hole transport layer between the emissive layer and the first electrode, said at least one of the hole injection layer and the hole transport layer comprising a polymer represented by Formula 1:

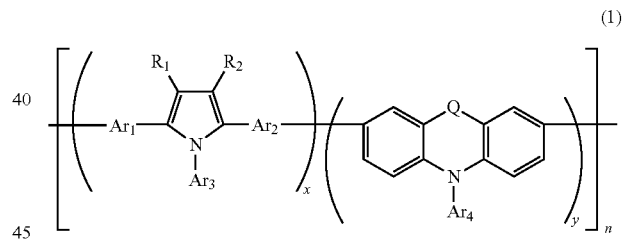

where x and y are each real numbers from 0.01 to 0.99;

$R_1$ and $R_2$ are each independently selected from the group consisting of a hydrogen atom, a substituted or unsubstituted $C_1$-$C_{30}$ alkyl group, a substituted or unsubstituted $C_1$-$C_{30}$ cycloalkyl group, a substituted or unsubstituted $C_1$-$C_{30}$ alkoxy group, a substituted or unsubstituted $C_6$-$C_{30}$ aryl group, a substituted or unsubstituted $C_2$-$C_{30}$ heteroaryl group, a substituted or unsubstituted $C_4$-$C_{30}$ heterocyclic group, and $C_6$-$C_{30}$ fused aryl group, and $R_1$ and $R_2$ can be joined to form a ring;

$Ar_1$ and $Ar_2$ are each independently selected from the group consisting of a phenylene, a tolylene, a naphthylene, a stilbenylene, an anthracenylene, a terphenylene, a pyrenylene, a diphenylanthracenylene, a dinaphthylanthracenylene, a pentacenylene, derivatives thereof, a substituted or unsubstituted $C_2$-$C_{30}$ heteroarylene group, and a substituted or unsubstituted $C_2$-$C_{30}$ heterocyclic group;

$Ar_3$ is each independently selected from the group consisting of a hydrogen, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_2$-$C_{30}$ heteroaryl group, a substituted or unsubstituted $C_2$-$C_{30}$ heterocyclic group, and a $C_6$-$C_{30}$ fused aryl group;

$Ar_4$ is each independently selected from the group consisting of a hydrogen, a substituted or unsubstituted $C_1$-$C_{30}$ alkyl group, a substituted or unsubstituted $C_1$-$C_{30}$ alkoxy group, a substituted or unsubstituted $C_2$-$C_{30}$ heteroaryl group, a substituted or unsubstituted $C_2$-$C_{30}$ heterocyclic group, and a substituted or unsubstituted $C_6$-$C_{30}$ fused aryl group;

Q is CH=CH, O, S, Se, or $(CH_2)_m$, where m is a real number from 1 to 10; and pyrenylene, a diphenylanthracenylene, a dinaphthylanthracenylene, a pentacenylene, and derivatives thereof;

$Ar_3$ is selected from the group consisting of a hydrogen, a phenyl, a tolyl, a naphthyl, a stilbenzyl, a fluorenyl, an anthracenyl, a terphenyl, a pyrenyl, a diphenylanthracenyl, a dinaphthylanthracenyl, a pentacenyl and their derivatives, a hexylphenyl, an octanoylphenyl, a bromophenyl, a hydroxyphenyl, a thienyl, a pyridyl, an azobenzenyl, a ferrocenyl, a carbazoyl, a porphyrin and derivatives thereof; and $Ar_4$ is selected from the group consisting of a hydrogen, a thienyl, a pyridyl, a carbazoyl, a porphyrin and derivatives thereof.

15. The organic electroluminescent device of claim 13, wherein the polymer compound is represented by Formula 7:

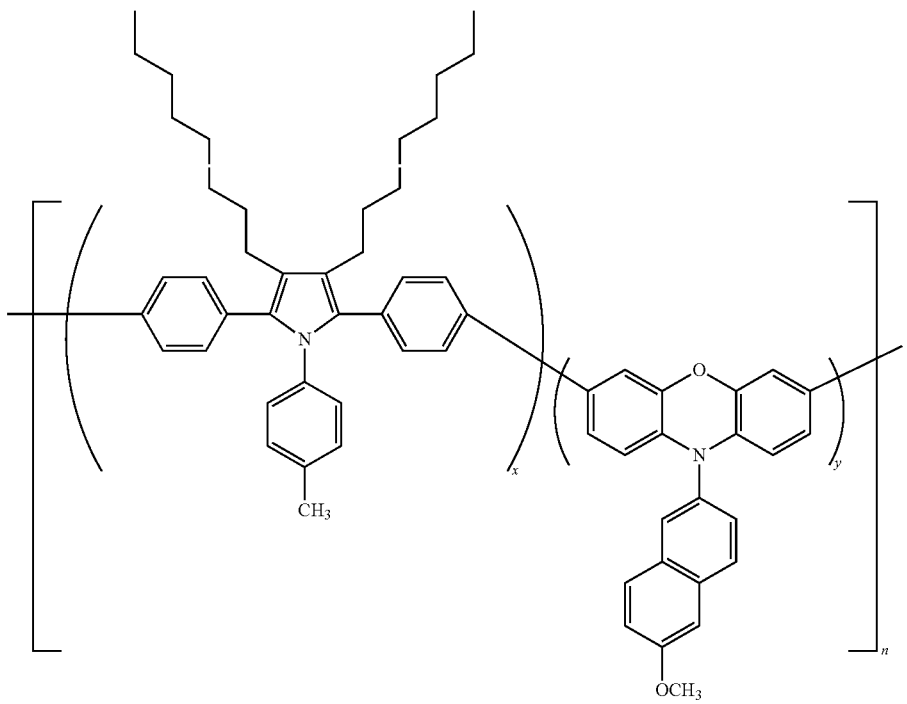

(7)

n is the degree of polymerization, and is a real number from 10 to 300.

14. The organic electroluminescent device of claim 13, wherein $R_1$ and $R_2$ are each independently selected from the group consisting of a hydrogen, a methyl, an ethyl, a propyl, an isopropyl, a butyl, an isobutyl, a pentyl, a hexyl, an ethylhexyl, a heptyl, an octyl, an isooctyl, a nonyl, a decyl, a dodecyl, a hexadecyl, an octadecyl, a docodecyl, a cyclopropyl, a cyclopentyl, a cyclohexyl, an acetyl, an octanoyl, a benzoyl, a methoxy, an ethoxy, an ethylenedioxy, a butoxy, a hexyloxy, a methoxyethoxyethyl, a methoxyethoxyethoxyethyl, a cyanoethyl, a carboxymethyl, a phenyl, a phenoxy, a tolyl, a benzyl, a naphthylanthracenyl, a terphenyl, a pyrenyl, a diphenylanthracenyl, a pentacenyl, a triphenylamine, and derivatives thereof;

$Ar_1$ and $Ar_2$ are each independently selected from the group consisting of a phenylene, a tolylene, a naphthylene, a stilbenzylene, an anthracenylene, a terphenylene, a where x and y are each real numbers from 0.01 to 0.99, n is the degree of polymerization and is a real number from 10 to 150, and Hex is a hexyl group.

16. The organic electroluminescent device of claim 13, wherein the emissive layer further comprises a dopant.

17. The organic electroluminescent device of claim 16, wherein the dopant is at least one selected from the group consisting of an acceptor material, an organic metal complex, a metal oxide, and an ion salt.

18. The organic electroluminescent device of claim 16, wherein the number-average molecular weight (Mn) of the polymer compound is 10,000 through 200,000.

19. The organic electroluminescent device of claim 16, wherein the emissive layer is formed of at least one selected from the group consisting of a green-phosphorescence dopant and a red-phosphorescence dopant.

* * * * *